(12) United States Patent
Park

(10) Patent No.: US 8,487,336 B2
(45) Date of Patent: Jul. 16, 2013

(54) LIGHT EMITTING DEVICE PACKAGE

(75) Inventor: Hyung Jo Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 57 days.

(21) Appl. No.: 12/812,915

(22) PCT Filed: Aug. 31, 2009

(86) PCT No.: PCT/KR2009/004869
§ 371 (c)(1),
(2), (4) Date: Jul. 14, 2010

(87) PCT Pub. No.: WO2010/024635
PCT Pub. Date: Mar. 4, 2010

(65) Prior Publication Data
US 2011/0049553 A1    Mar. 3, 2011

(30) Foreign Application Priority Data

Sep. 1, 2008  (KR) .................. 10-2008-0085884

(51) Int. Cl.
*H01L 33/00*     (2010.01)
(52) U.S. Cl.
USPC ............................................ 257/99; 257/100
(58) Field of Classification Search
CPC .................... H01L 2224/48091; H01L 33/62
USPC .................................................. 257/99, 100
See application file for complete search history.

(56) References Cited

U.S. PATENT DOCUMENTS

| | | | | |
|---|---|---|---|---|
| 6,060,729 A * | 5/2000 | Suzuki et al. | | 257/99 |
| 6,355,946 B1 * | 3/2002 | Ishinaga | | 257/98 |
| 7,038,195 B2 * | 5/2006 | Kida et al. | | 250/239 |
| 7,564,071 B2 | 7/2009 | Konno | | |
| 7,728,341 B2 * | 6/2010 | Mazzochette et al. | | 257/98 |
| 2006/0138436 A1 | 6/2006 | Chen et al. | | 257/98 |
| 2006/0198162 A1 * | 9/2006 | Ishidu et al. | | 362/623 |
| 2007/0102711 A1 | 5/2007 | Aoyagi et al. | | 257/79 |
| 2008/0283819 A1 * | 11/2008 | Konno | | 257/13 |
| 2011/0095263 A1 * | 4/2011 | Son | | 257/13 |
| 2011/0198653 A1 * | 8/2011 | Cho | | 257/98 |

FOREIGN PATENT DOCUMENTS

| | | |
|---|---|---|
| CN | 1471178 | 1/2004 |
| CN | 1833322 A | 9/2006 |
| CN | 101308899 | 11/2008 |
| EP | 1 385 217 | 1/2004 |
| JP | 2006-024701 A | 1/2006 |
| KR | 10-0580765 B1 | 5/2006 |
| KR | 10-2008-0008767 A | 1/2008 |

(Continued)

OTHER PUBLICATIONS

PCT International Search Report dated Apr. 1, 2010 issued in Application No. PCT /KR2009/004869.

(Continued)

*Primary Examiner* — Jarrett Stark
(74) *Attorney, Agent, or Firm* — KED & Associates, LLP

(57) ABSTRACT

A light emitting device package is provided. The light emitting device package includes a substrate including a first cavity having a first depth and a lateral surface inclined with respect to a bottom surface and a second cavity having a second depth recessed from the bottom surface of the first cavity and a lateral surface perpendicular to the bottom surface of the first cavity, a first electrode layer and a second electrode layer on the substrate, and a light emitting diode within the second cavity, the light emitting diode being electrically connected to the first and second electrode layers.

21 Claims, 1 Drawing Sheet

FOREIGN PATENT DOCUMENTS

KR    10-0853412 B1    8/2008

OTHER PUBLICATIONS

Korean Office Action dated May 31, 2010 issued in Application No. 10-2008-0085884.

Chinese Office Action dated Dec. 17, 2012 for Application 200980101104.9.

Chinese Office Action dated Apr. 18, 2013 for Application 200980101104.9.

* cited by examiner

LIGHT EMITTING DEVICE PACKAGE

TECHNICAL FIELD

The present disclosure relates to a light emitting device package.

BACKGROUND ART

A light emitting diode (LED) has been widely used as a light emitting device. The LED includes an N-type semiconductor layer, an active layer, and a P-type semiconductor layer that are stacked on each other so that light is generated from the active layer and emitted to the outside according to a voltage applied thereto.

A light emitting device package includes the LED, a substrate supporting the LED, and a conductive member supplying electric power to the LED.

An effort to increase light efficiency by improving a structure of the light emitting device has been now continued. Also, an effort to increase the light efficiency by improving a structure of the light emitting device package including the light emitting device has been continued.

DISCLOSURE

Technical Problem

Embodiments provide a light emitting device package having a novel structure.

Embodiments also provide a light emitting device package having improved light emitting efficiency.

Technical Solution

In one embodiment, a light emitting device package includes: a substrate including a first cavity having a first depth and a lateral surface inclined with respect to a bottom surface and a second cavity having a second depth recessed from the bottom surface of the first cavity and a lateral surface perpendicular to the bottom surface of the first cavity; a first electrode layer and a second electrode layer on the substrate; and a light emitting diode within the second cavity, the light emitting diode being electrically connected to the first and second electrode layers.

In another embodiment, a light emitting device package includes: a substrate including a first cavity having a first depth and a second cavity having a second depth recessed from the bottom surface of the first cavity; a first electrode layer on a portion of the first cavity and an overall lateral and bottom surfaces of the second cavity; a second electrode layer on a portion of the first cavity; and a light emitting diode within the second cavity, the light emitting diode being electrically connected to the first and second electrode layers.

In further another embodiment, a light emitting device package includes: a substrate including a first cavity having a first depth and a second cavity having a second depth recessed from the bottom surface of the first cavity; a first electrode layer and a second electrode layer on the substrate, the first and second electrode layer being electrically isolated from each other; a light emitting diode within the second cavity, the light emitting diode in which a portion thereof protrudes outwardly from the second cavity being electrically connected to the first and second electrode layers.

In another embodiment, a light emitting device package comprising: a light emitting structure including a first conductive semiconductor layer, an active layer adjacent to the first conductive semiconductor layer, and a second conductive semiconductor layer, the first semiconductor layer, the active layer and the second semiconductor layer having prescribed thicknesses such that the light emitting structure has a total prescribed thickness; a supporting layer to support the light emitting structure, and having a thickness, which is greater than the total prescribed thickness; and a substrate having first and second surfaces, the first and second surfaces being opposing surfaces, and a recess provided on one of the first surface or the second surface, the recess having a prescribed depth, the supporting layer is provided in the recess, and prescribed depth is no greater than the thickness of the supporting layer.

The details of one or more embodiments are set forth in the accompanying drawings and the description below. Other features will be apparent from the description and drawings, and from the claims.

Advantageous Effects

Embodiments may provide the light emitting device package having a novel structure.

Embodiments may also provide the light emitting device package having the improved light emitting efficiency.

MODE FOR INVENTION

Figure 1:
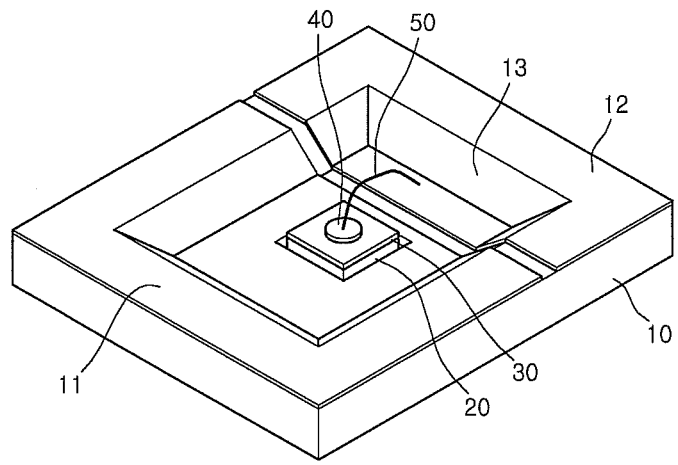
FIG. 1 is a perspective view of a light emitting device package according to an embodiment.

In the following description, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. In addition, it will also be understood that when a layer is referred to as being 'between' two layers, it can be the only layer between the two layers, or one or more intervening layers may also be present.

In the drawings, the thickness or size of each layer is exaggerated, omitted, or schematically illustrated for convenience in description and clarity. Also, the size of each element does not entirely reflect an actual size.

Figure 2:
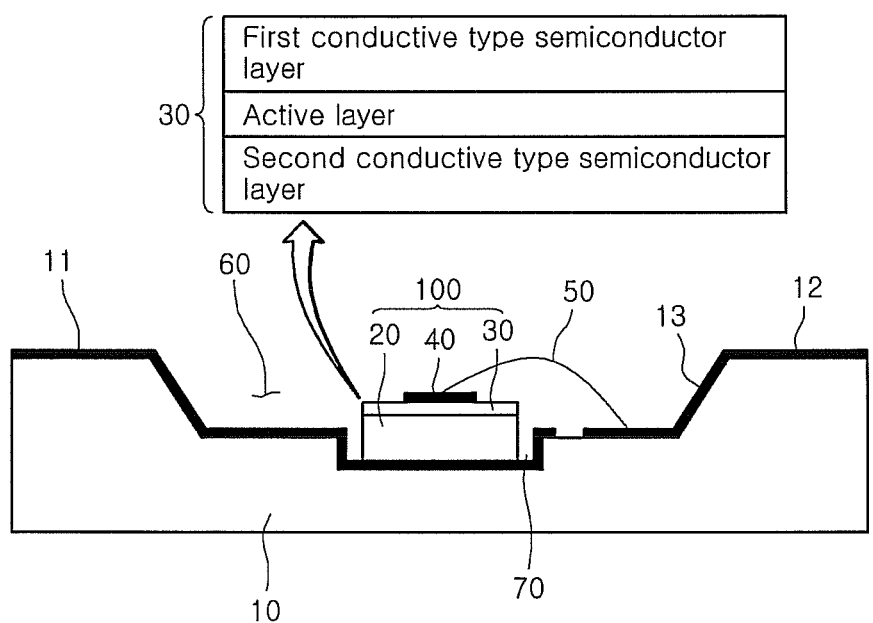
FIG. 2 is a sectional view of a light emitting device package according to an embodiment.

FIG. 1 is a perspective view of a light emitting device package according to an embodiment, and FIG. 2 is a sectional view of a light emitting device package according to an embodiment.

Referring to FIGS. 1 and 2, a light emitting device package according to an embodiment includes a substrate 10, a first electrode layer 11, a second electrode layer 12, a light emitting diode (LED) 100, and a wire 50. The substrate 10 has a first cavity 60 and a second cavity 70 defined inside the first cavity 60. The first and second electrode layers 11 and 12 are disposed on the substrate 10 and are electrically isolated from each other. The LED 100 is disposed within the second cavity 70, and a portion of the LED 100 protrudes. The wire 50 electrically connects the LED 100 to the substrate 10.

Although not shown, a molded member formed of a resin may be disposed within the first and second cavities 60 and 70 including the LED 100. The molded member may contain a phosphor.

The substrate 10 may include various substrates such as a printed circuit board (PCB), a silicon wafer, and a resin substrate. The first cavity 60 and the second cavity 70 are defined in a top surface of the substrate 10. The first cavity 60 has a first area and a first depth. The second cavity 70 has a second area less than first area and a second depth recessed from a bottom surface of the first cavity by a depth less than the first depth.

As shown in FIGS. 1 and 2, the first cavity 60 has an inclined lateral surface 13. A lateral surface of the second cavity 70 is perpendicular to a bottom surface of the second cavity 70.

The first electrode layer 11 and the second electrode layer 12 may include a function for supplying a power to the LED 100 and a function for reflecting light emitted from the LED 100.

For example, the first electrode layer 11 and the second electrode layer 12 are formed of a copper (Cu) material. Also, aluminium (Al) or silver (Ag) having a high light reflectance may be coated on top surfaces of the first and second electrode layers 11 and 12.

The first electrode layer 11 may be disposed on the top surface of the substrate 10, the lateral surface of the first cavity 60, the bottom surface of the first cavity 60, the lateral surface of the second cavity 70, and the bottom surface of the second cavity 70. The second electrode layer 12 may be disposed on the top surface of the substrate 10, the lateral surface of the first cavity 60, and the bottom surface of the first cavity 60.

The first electrode layer 11 may be disposed on the overall lateral and bottom surfaces of the second cavity 70 and a portion of the first cavity 60. The second electrode layer 12 may be partially disposed on only the first cavity 60.

Each of the first and second electrode layers 11 and 12 may have a relative wide area in a state where they are electrically isolated from each other.

The LED 100 may include a support layer 20, a light emitting layer 30, and an electrode layer 40.

The support layer 20 is formed of a conductive material to electrically connect the first electrode layer 11 to the light emitting layer 30. For example, the support layer 20 may be formed of a metal material, i.e., a material containing at least one of Cu, Ni, Au, Al, Cr, and Ti. Also, a reflective layer (not shown) formed of a metal containing Ag or Al having a high light reflectance may be disposed on a top surface of the support layer 20.

The light emitting layer 30 may be formed of a nitride semiconductor material. For example, the light emitting layer 30 may include a first conductive type semiconductor layer, an active layer, and a second conductive type semiconductor layer.

The electrode layer 40 may electrically connect the light emitting layer 30 to the second electrode layer 12 through the wire 50. For example, the electrode layer 40 may include an ohmic electrode layer. The ohmic electrode layer may include a transparent electrode layer. For example, the electrode layer 40 may be formed of at least one of Ni, IZO, ITO, ZnO, $RuO_x$, $TiO_x$, and $IrO_x$.

In the light emitting device package according to an embodiment, the substrate 10 has the first cavity 60 and the second cavity 70. The LED 100 is installed within the second cavity 70.

Since the LED 100 is installed within the second cavity 70, an installation position of the LED 100 may be easily determined. Also, since a portion of the LED 100 is disposed within the second cavity 70, it may prevent external impacts from being directly applied to the LED 100.

The light emitting layer 30 of the LED 100 is disposed above the first and second electrode layers 11 and 12, which are disposed on the bottom surface of the first cavity 60. That is, the support layer 20 of the LED 100 has a thickness greater than the depth of the second cavity 70.

Also, the second cavity 70 may have a width 0.5% to 10% greater than that of the LED 100.

For example, when the LED 100 has a width of about 1000 μm×1000 μm in first and second directions, the second cavity 70 may have a width of about 1005 μm×1005 μm to about 1100 μm×1100 μm in the first and second directions.

That is, since the second cavity 70 has an area slightly greater than that of the LED 100, a distance between the support layer 20 and the lateral surface of the second cavity 70 may be ranging of about 2.5 μm to about 50 μm.

Thus, light emitted from the light emitting layer 30 of the LED 100 is not nearly advanced inside the second cavity 70. Most of the light is directly advanced toward an upper side or reflected by the first cavity 60, and then advanced toward the upper side.

In the light emitting device according to an embodiment, the light emitted from the light emitting layer 30 of the LED 100 may not be absorbed into the support layer 20 of the LED 100, but be mostly emitted to the outside.

Thus, in the light emitting device according to an embodiment, the light emitted from the LED 100 may be effectively emitted to the outside to maximize the light emitting efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments may be applicable to the light emitting device package used as a light source.

The invention claimed is:
1. A light emitting device package comprising:
a substrate comprising a first cavity having a first depth and a lateral surface inclined with respect to a bottom surface and a second cavity having a second depth recessed from the bottom surface of the first cavity and a lateral surface perpendicular to the bottom surface of the first cavity;
a first electrode layer on the first cavity and the second cavity of the substrate;
a second electrode layer on the first cavity of the substrate; and
a light emitting diode within the second cavity, the light emitting diode being electrically connected to the first electrode layer and the second electrode layer,
wherein the light emitting diode includes a light emitting layer, an electrode layer on a top surface of the light emitting layer and a support layer under a bottom surface of the light emitting layer, and
wherein the light emitting layer includes a first conductive semiconductor layer, an active layer adjacent to the first conductive semiconductor layer, and a second conductive semiconductor layer, wherein the support layer is foamed of a metal layer having a top surface that is higher than the bottom surface of the first cavity, and wherein the support layer has a thickness that is greater than the second depth of the second cavity, and the thickness of the support layer is greater than a thickness of the light emitting layer, wherein the second electrode layer is disposed between the support layer and a top surface of the substrate, wherein the support layer is disposed between the second electrode layer and the light emitting layer, wherein a lateral surface of the support layer includes an upper lateral surface and a lower lateral surface, the upper lateral surface of the support layer corresponds to the inclined lateral surface of the first cavity, and the lower lateral surface of the support layer corresponds to the perpendicular lateral surface of the second cavity.

2. The light emitting device package according to claim 1, wherein the support layer has a top surface that contacts the light emitting layer and a bottom surface that contacts the first electrode layer and is electrically connected to the first electrode layer, and the electrode layer is electrically connected to the second electrode layer by a wire.

3. The light emitting device package according to claim 1, wherein a reflective layer containing Ag or Al is disposed between the support layer and the light emitting layer.

4. The light emitting device package according to claim 2, wherein the second cavity has a width that is 0.5% to 10% greater than a width of the light emitting diode.

5. The light emitting device package according to claim 2, wherein a lateral surface of the light emitting diode is spaced apart from the lateral surface of the second cavity by a distance of about 2.5 μm to about 50 μm.

6. A light emitting device package comprising:
a substrate comprising a first cavity having a first depth and a second cavity having a second depth recessed from a bottom surface of the first cavity;
a first electrode layer on a portion of the first cavity and on lateral and bottom surfaces of the second cavity;
a second electrode layer on another portion of the first cavity; and
a light emitting diode within the second cavity, the light emitting diode being electrically connected to the first electrode layer and the second electrode layer,
wherein the light emitting diode includes a light emitting layer, an electrode layer on the light emitting layer and a support layer having conductivity under the light emitting layer, and
wherein the light emitting layer includes a first conductive semiconductor layer, an active layer adjacent to the first conductive semiconductor layer, and a second conductive semiconductor layer,
wherein the support layer is formed of a metal layer having a top surface that is higher than the bottom surface of the first cavity,
wherein the support layer has a thickness that is greater than the second depth of the second cavity, and the thickness of the support layer is greater than a thickness of the light emitting layer, and
wherein the light emitting layer is disposed at a position higher than the bottom surface of the first cavity,
wherein the second electrode layer is disposed between the support layer and a top surface of the substrate,
wherein the support layer is disposed between the second electrode layer and the light emitting layer,
wherein a lateral surface of the support layer includes an upper lateral surface and a lower lateral surface, the upper lateral surface of the support layer corresponds to an inclined lateral surface of the first cavity, and the lower lateral surface of the support layer corresponds to a lateral surface of the second cavity, wherein the inclined lateral surface of the first cavity is inclined with respect to a level bottom surface of the second cavity.

7. The light emitting device package according to claim 6, wherein the support layer has a top surface that contacts the light emitting layer and a bottom surface that contacts the first electrode layer and is electrically connected to the first electrode layer, and the electrode layer is electrically connected to the second electrode layer by a wire.

8. The light emitting device package according to claim 6, wherein a portion of the light emitting diode protrudes from the second cavity.

9. The light emitting device package according to claim 6, wherein the first cavity has the inclined lateral surface with respect to a level bottom surface of the first cavity, and the second cavity has a perpendicular lateral surface with respect to the bottom surface of the second cavity.

10. The light emitting device package according to claim 1, wherein one of the first electrode layer or the second electrode layer is disposed at an entire lateral surface of the second cavity.

11. The light emitting device package according to claim 1, wherein the support layer is a conductive material.

12. The light emitting device package according to claim 1, wherein the support layer is formed of one of Cu, Ni, Au, Al, Cr or Ti.

13. The light emitting device package according to claim 6, wherein the support layer is formed of one of Cu, Ni, Au, Al, Cr or Ti.

14. The light emitting device package according to claim 2, wherein the wire is directly connected between the electrode layer of the light emitting diode, and the second electrode layer is disposed on the bottom surface of the first cavity.

15. The light emitting device package according to claim 2, wherein both ends of the wire are disposed at a position higher than the bottom surface of the first cavity and spaced apart from the second cavity.

16. The light emitting device package according to claim 1, wherein the bottom surface of the first cavity is a level surface connected between the lateral surface of the second cavity and the inclined lateral surface of the first cavity.

17. The light emitting device package according to claim 16, wherein a lateral surface of the light emitting layer corresponds to the inclined lateral surface of the first cavity.

18. The light emitting device package according to claim 1, wherein the bottom surface of the light emitting layer is disposed at a position higher than a bottom of the inclined lateral surface of the first cavity.

19. The light emitting device package according to claim 1, wherein an entire region of a lateral surface of the light emitting layer of the light emitting diode corresponds to the inclined lateral surface of the first cavity.

20. A light emitting device package comprising:
a substrate comprising a first cavity having a first depth and a lateral surface inclined with respect to a bottom surface and a second cavity having a second depth recessed from the bottom surface of the first cavity and a lateral surface perpendicular to the bottom surface of the first cavity;
a first electrode layer on the first cavity and the second cavity of the substrate;
a second electrode layer on the first cavity of the substrate;

a light emitting diode disposed in the second cavity, the light emitting diode being electrically connected to the first electrode layer and the second electrode layer; and a molding member in the first cavity and the second cavity, wherein the light emitting diode includes a light emitting layer, an electrode layer on the light emitting layer and a support layer under the light emitting layer, and wherein the light emitting layer is formed of a plurality of semiconductors, wherein the support layer is formed of a metal layer having a top surface that is higher than the bottom surface of the first cavity, wherein the support layer has a thickness that is greater than the second depth of the second cavity, and the thickness of the support layer is greater than a thickness of the light emitting layer, wherein a lateral surface of the support layer is spaced apart from the lateral surface of the second cavity by a distance of approximately 2.5 μm to approximately 50 μm, wherein the second electrode layer is disposed between the support layer and a top surface of the substrate, wherein the support layer is disposed between the second electrode layer and the light emitting layer, and wherein a lateral surface of the support layer includes an upper lateral surface and a lower lateral surface, the upper lateral surface of the support layer corresponds to an inclined lateral surface of the first cavity, and the lower lateral surface of the support layer corresponds to a lateral surface of the second cavity.

21. The light emitting device package according to claim 20, further comprising a wire connected to the electrode layer of the light emitting diode and the second electrode layer, wherein both ends of the wire are disposed at a position higher than the bottom surface of the first cavity and spaced apart from the second cavity.

* * * * *